(12) United States Patent
Kilker et al.

(10) Patent No.: US 9,378,836 B1
(45) Date of Patent: Jun. 28, 2016

(54) SENSING CIRCUIT FOR A NON-VOLATILE MEMORY CELL HAVING TWO COMPLEMENTARY MEMORY TRANSISTORS

(71) Applicant: International Business Machines Corporation, Armonk, NY (US)

(72) Inventors: Robert E. Kilker, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/574,462

(22) Filed: Dec. 18, 2014

(51) Int. Cl.
G11C 16/26 (2006.01)
G11C 16/24 (2006.01)

(52) U.S. Cl.
CPC .............. *G11C 16/26* (2013.01); *G11C 16/24* (2013.01)

(58) Field of Classification Search
CPC .......... G11C 16/26; G11C 16/24; G11C 7/06; G11C 7/062
See application file for complete search history.

(56) References Cited

U.S. PATENT DOCUMENTS

| 5,438,287 | A | * | 8/1995 | Faue ..................... G11C 7/062 327/312 |
| 5,754,477 | A | | 5/1998 | Forbes |
| 5,793,775 | A | | 8/1998 | Roohparvar |
| 6,249,471 | B1 | * | 6/2001 | Roy ..................... G11C 7/1051 365/189.05 |
| 6,654,309 | B1 | | 11/2003 | Hirose |
| 7,499,315 | B2 | | 3/2009 | Lowrey et al. |
| 7,558,145 | B2 | | 7/2009 | Rao et al. |
| 8,077,493 | B2 | | 12/2011 | Katayama |
| 8,149,640 | B2 | | 4/2012 | Kobatake |
| 8,406,061 | B2 | | 3/2013 | Choi |
| 8,605,497 | B2 | | 12/2013 | Lam et al. |
| 2003/0156457 | A1 | | 8/2003 | Ooishi |
| 2006/0083098 | A1 | | 4/2006 | Ho |
| 2008/0117700 | A1 | * | 5/2008 | Nakamura ......... G11C 11/4099 365/205 |
| 2008/0151588 | A1 | * | 6/2008 | Agarwal ................ G11C 15/04 365/49.1 |
| 2011/0063924 | A1 | | 3/2011 | Luo et al. |
| 2015/0029778 | A1 | | 1/2015 | Yoon et al. |
| 2015/0138868 | A1 | | 5/2015 | Castalino et al. |
| 2015/0138891 | A1 | | 5/2015 | Iyer et al. |

OTHER PUBLICATIONS

Anonymous, "Slew Rate Control Circuits for Memory," IP.com No. IPCOM000004727D, IP.com Electronic Publication: Apr. 23, 2001.

(Continued)

*Primary Examiner* — J. H. Hur
(74) *Attorney, Agent, or Firm* — Scott S. Dobson; Robert Williams

(57) ABSTRACT

Voltage is increased on a wordline signal. The wordline signal is applied to a programmed FET and an unprogrammed FET of a memory cell. The programmed FET has a higher threshold voltage than the unprogrammed FET. The programmed FET is connected to a first bitline and the unprogrammed FET is connected to a second bitline. It is determined that the second bitline has reached a threshold voltage. In response to determining the second bitline has reached the threshold voltage, the first bitline is pulled towards ground. A signal is output based on a low voltage of the first bitline and a high voltage of the second bitline.

12 Claims, 3 Drawing Sheets

(56) References Cited

OTHER PUBLICATIONS

Siemens et al., "Memory Circuit with Multi-Bit-Line Direct Sensing," Original Publication Date: Feb. 25, 2004, IP.com No. IPCOM000021650D, IP.com Electronic Publication: Jan. 29, 2004, Copyright: Siemens AG 2004.

Kilker, "Non-Volatile Memory Sense Circuit," U.S. Appl. No. 14/576,325, filed Dec. 19, 2014.

IBM, "List of IBM Patents or Patent Applications Treated as Related", dated Dec. 19, 2014, pp. 1-2.

* cited by examiner

SENSING CIRCUIT FOR A NON-VOLATILE MEMORY CELL HAVING TWO COMPLEMENTARY MEMORY TRANSISTORS

BACKGROUND

The present disclosure relates to computer memory, and more specifically, to a sense circuit for non-volatile memory.

Non-volatile memory is computer memory which can retain stored information even when not powered. Some types of non-volatile memory may contain field-effect transistors which may be programmed. Charge trapping can be used to shift the voltage threshold of field-effect transistors.

SUMMARY

According to embodiments of the present disclosure, a method for sensing a non-volatile memory cell is disclosed. The method includes increasing a voltage of a wordline signal. The wordline signal is applied to a programmed FET and an unprogrammed FET of a memory cell. The programmed FET has a higher threshold voltage than the unprogrammed FET. The programmed FET is connected to a first bitline and the unprogrammed FET is connected to a second bitline. The method further includes determining the second bitline has reached a threshold voltage. The method further includes, in response to the determining the second bitline has reached the threshold voltage, pulling the first bitline towards ground. The method further includes outputting a signal based on a low voltage of the first bitline and a high voltage of the second bitline.

Further disclosed herein are embodiments of a circuit for sensing a non-volatile memory cell. The circuit includes a first NFET connected to a first bitline and a second NFET connected to a second bitline. The first NFET is configured to pull the first bitline toward ground in response to the second bitline reaching a first voltage. The second NFET is configured to pull the second bitline toward ground in response to the first bitline reaching a second voltage.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
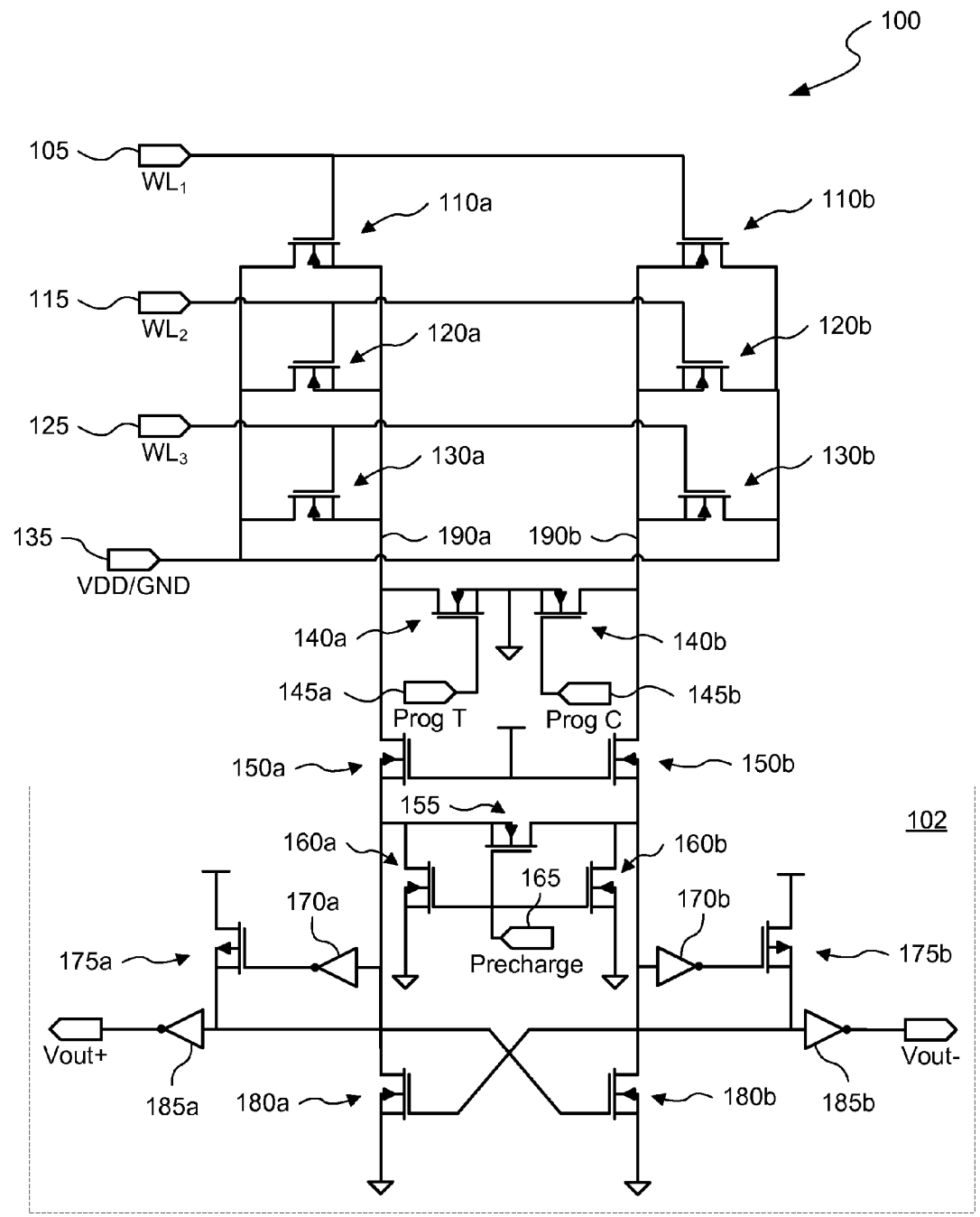
FIG. 1 depicts a diagram of an example memory circuit with a sensing circuit for sensing the programming of memory cells.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to sense circuits for non-volatile memory. While the present disclosure is not necessarily limited to such applications, various aspects of the disclosure may be appreciated through a discussion of various examples using this context.

Embodiments of the present disclosure may provide for a sense circuit for sensing the state of a non-volatile memory cell. The memory cell has two field-effect transistors (FETs). The memory cell is programmed to create a logical zero or a logical one based on which FET is programmed. Programming the FET may be done using charge trapping to increase the voltage threshold (Vt) on the programmed FET.

Both FETs share the same wordline signal. As the wordline signal increases, the FET with the lower Vt (i.e. the unprogrammed FET) will turn on first, pulling its corresponding bitline up first as well as pulling it up faster than the bitline connected to the programmed FET. The sense circuit includes large cross-coupled NFETs connected to each bitline. The bitline which rises first turns on the NFET connected to the opposing bitline which pulls the opposing bitline towards ground and prevents it from turning on the second NFET. This keeps the bitline for the unprogrammed FET high and the bitline for the programmed FET low.

In some embodiments, each bitline is further connected to a PFET keeper device which finishes the bitline which activates its corresponding NFET to full supply voltage (Vdd). Further, each bitline may be connected to an inverter which outputs a signal for the sense circuit based on the voltages of each bitline.

Referring to FIG. 1, a diagram of an example memory circuit 100 with a sensing circuit 102 for sensing the programming of memory cells is depicted. Circuit 100 includes three memory cells which each include two FETs. A first memory cell includes FETs 110a-b. A second memory cell includes FETs 120a-b. A third memory cell includes FETs 130a-b. Although, three memory cells are depicted, any number of memory cells may be included. There is a wordline signal for each memory cell. Wordline 105 is shared by FETs 110a-b. Wordline 115 is shared by FETs 120a-b. Wordline 125 is shared by FETs 130a-b.

To program one of the FETs of a memory cell, a high voltage may be applied to the FET through the corresponding wordline and supply voltage 135. The bitline for the FET to be programmed may be brought to ground to provide a stream of electrons flowing through the FET. Electrons may be trapped in the gate dielectric of the NFET (or holes trapped in the gate dielectric of the PFET) which leads to a higher absolute Vt for the respective FET type. As depicted, program true 145a may be activated to turn on FET 140a and bring bitline 190a down to ground to program either FET 110a, FET 120a, or FET 130a. Similarly, program complement may be activated to turn on FET 140b and bring bitline 190b down to ground to program either FET 110b, FET 120b, or FET 130b.

For example, to program FET 110a, wordline 105 and supply voltage 135 are set to a high voltage. Program true 145a is made high to activate FET 140a and pull bitline 190a toward ground. This causes high energy electrons (charge carriers) to flow through the channel of NFET (FET) 110a and become trapped in the gate dielectric of the device causing the absolute value of the Vt to increase.

FETs 150a-b may be configured to protect sense circuit 102 from the high voltage produced during the programming of memory cells.

To prepare for sensing the programming of a memory cell, bitlines 190a-b may be precharged to ground and balanced. Precharge 165 may be brought high to activate NFET 155, which balances bitlines 190a-b, and to activate NFETs 160a-b to bring bitlines 190a-b to ground. Supply voltage 135 is applied and the wordline applied to the applicable memory cell rises. A slow wordline slew may be used to help differentiate between the programmed and unprogrammed FETs in the memory cell. An example slow wordline slew increases from 10% Vdd to 90% Vdd in about 200-800 ps (picoseconds). As the wordline voltage increases, it activates the FETs of the memory cell causing the voltage of the corresponding bitlines to increase. The unprogrammed FET will turn on first as it has a lower Vt. Thus, the bitline connected to the unprogrammed FET will increase faster than the bitline connected to the programmed FET.

NFETs 180a-b are configured to pull the connected bitline to ground when turned on by the other bitline. NFET 180a is configured to pull bitline 190a toward ground in response to the increase in voltage of bitline 190b. Similarly, NFET 180b is configured to pull bitline 190b toward ground in response to the increase in voltage of bitline 190a. Thus, the bitline whose voltage rises faster keeps rising while preventing the other bitline from rising. NFETs 180a-b may be much larger than the FETs of the memory cells such that they overpower the FET quickly when pulling the corresponding bitline to ground.

Additionally, inverters 170a-b and PFETs 175a-b are configured to pull the faster rising bitline to full Vdd rail. Inverters 170a-b are configured to change output from high to low once the input bitline reaches a specified voltage. The low output turns on the corresponding PFET 175a or 175b which brings the bitline to full Vdd rail.

Inverters 185a-b provide output from sense circuit 102. Inverter 185a may provide the main output for sense circuit 102. For example, a high output from inverter 185a may represent a logical one and a low output may represent a logical zero.

For example, assume FET 120a has been programmed. To read the memory cell containing FETs 120a-b, bitlines 190a-b are balanced and brought to ground with precharge 165. Precharge 165 is turned off and wordline 115 is slowly raised. FET 120b has a lower Vt than FET 120a. Thus, FET 120b will turn on first and cause bitline 190b to rise before bitline 190a. Bitline 190b will turn on NFET 180a which will pull bitline 190a toward ground. Inverter 170b will change its output to low in response to rising bitline 190b and activate PFET 175b to bring bitline 190b to Vdd rail. The main output from inverter 185a will be high (i.e. logical one) in response to bitline 190a being low and the output of inverter 185b will be low in response to bitline 190b being high. Sense circuit 102 may stay in this state until a new precharge to ground.

Figure 2:
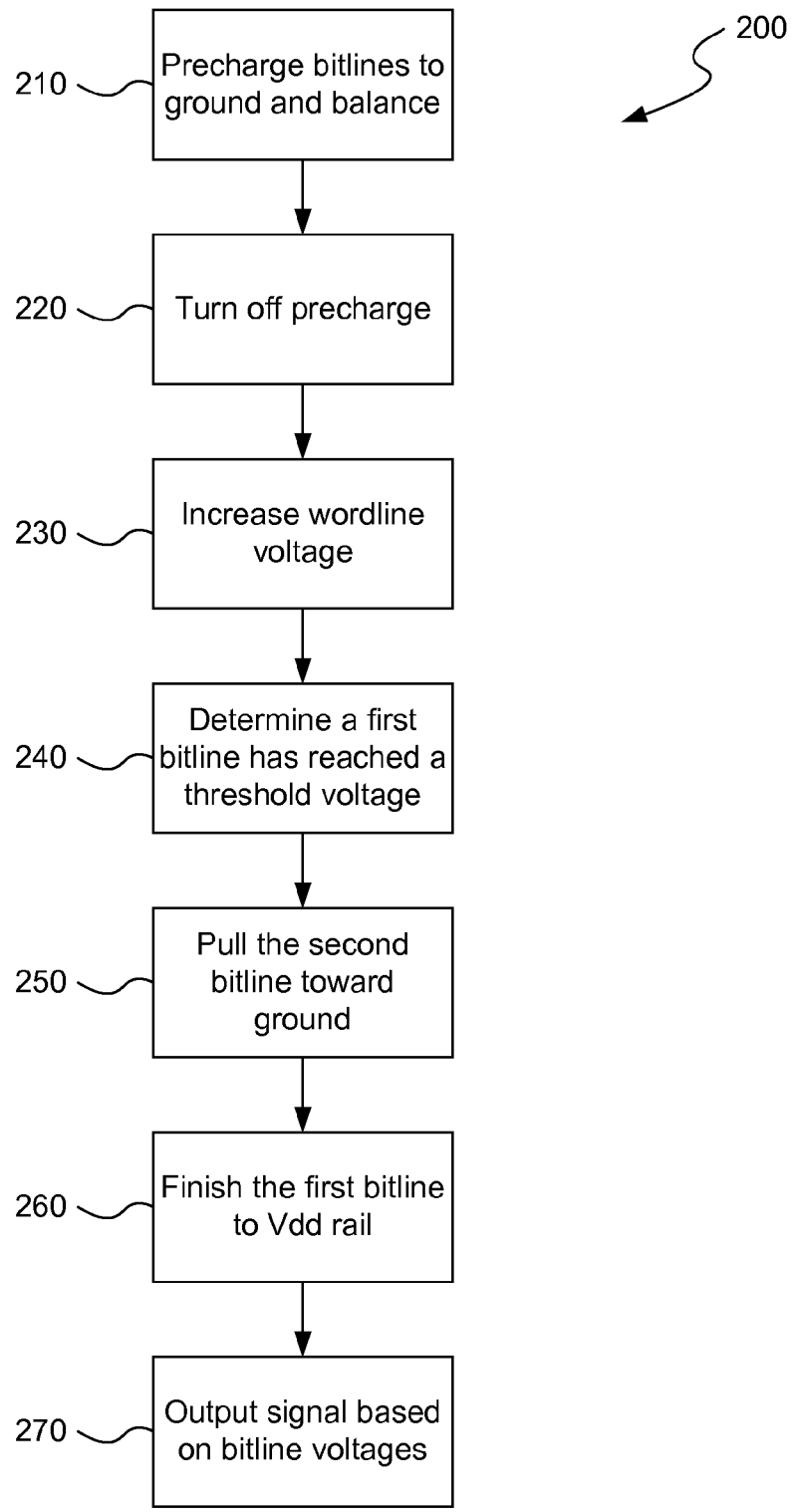
FIG. 2 depicts a flow diagram of an example method for sensing the programming of a nonvolatile memory cell.

Referring to FIG. 2, a flow diagram of an example method 200 for sensing the programming of a nonvolatile memory cell is depicted. At block 210, the bitlines coming from each FET in the memory cell are precharged to ground and balanced. At block 220, the precharge is turned off. At block 230, the wordline voltage for the memory cell is increased. A slow wordline slew may be used such as a wordline slew that increases from 10% Vdd to 90% Vdd in about 200-800 ps. At block 240, it is determined that a first bitline has reached a threshold voltage. The first bitline may be applied to the gate of an NFET which has the threshold voltage. At block 250, in response to determining that the first bitline has reached the threshold voltage, the second bitline is pulled toward ground. The NFET may be turned on by the first bitline to pull the second bitline toward ground. The NFET may be much larger than the memory cell FET such that the bitline may be pulled toward ground quickly. At block 260, the first bitline is pulled up to Vdd rail. At block 270, a signal is output based on the voltages of the first and second bitlines. The signal may represent a logical zero or a logical one.

Figure 3:
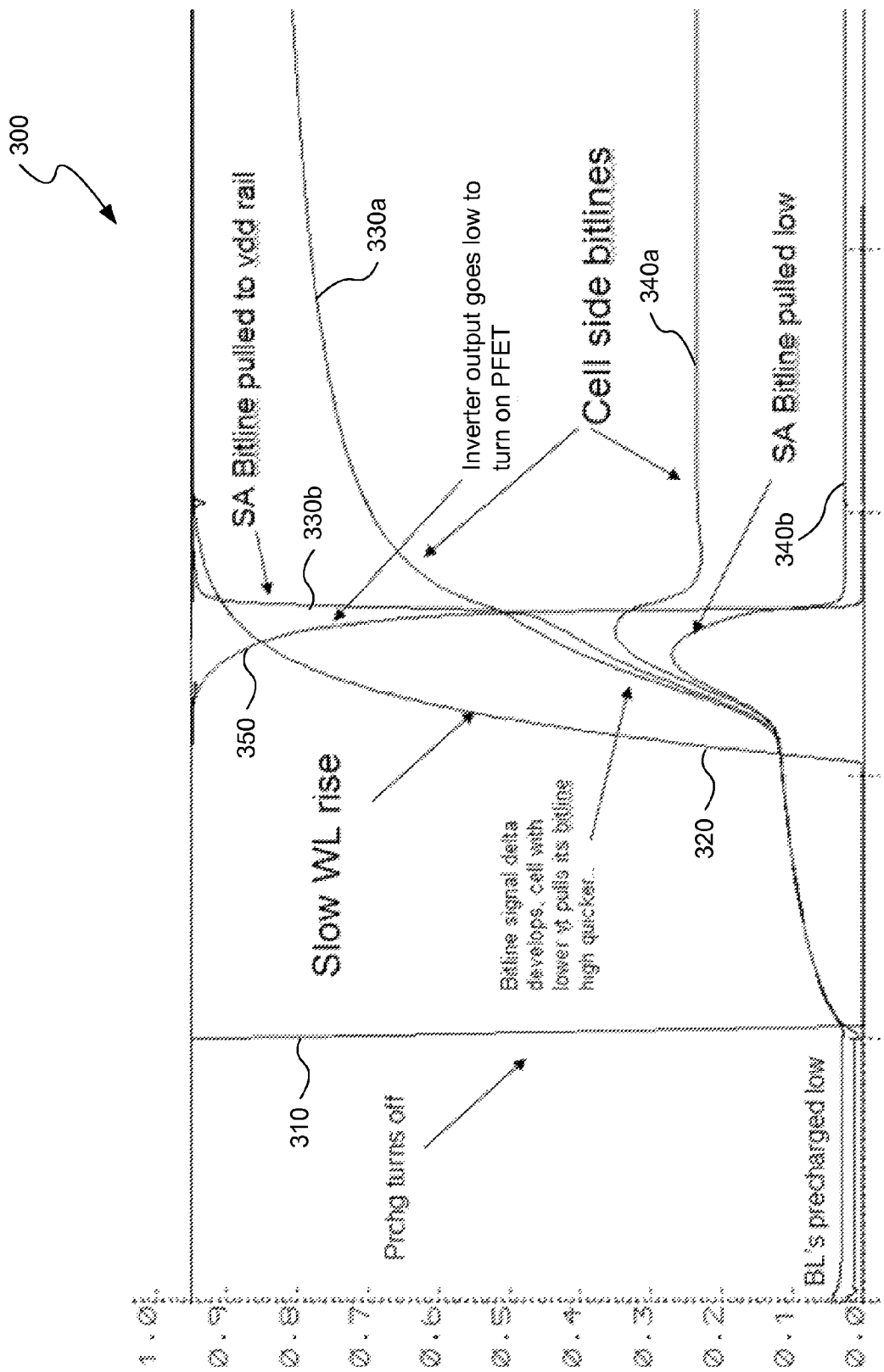
FIG. 3 depicts a graph of example waveforms associated with a memory cell and sense circuit.

Referring to FIG. 3, a graph 300 of example waveforms associated with a memory cell and sense circuit such as that depicted in FIG. 1. At the left side of graph 300, the precharge 310 is high which causes the bitlines 330a-b, 340a-b to be low. Bitline 330a and bitline 340a are the bitlines on the memory cell side while bitline 330b and bitline 340b are the corresponding bitlines on the sense circuit side. When precharge 310 is turned off, bitlines 330a-b, 340a-b float. The wordline 320 slowly rises and turns on the FETs in the memory cell to cause bitlines 330a-b, 340a-b to rise. A signal delta develops between bitlines 330a-b and 340a-b as bitlines 330a-b are connected to the memory cell FET with the lower Vt. Bitline 330b activates a large NFET which pulls bitlines 340a-b toward ground and prevents them from rising. The output of an inverter 350 goes low in response to rising bitline 330b. The low output of inverter 350 opens a PFET which pulls up bitline 330b to Vdd rail.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A memory cell sense circuit, the circuit comprising:
a first NFET connected to a first bitline and a second NFET connected to a second bitline, the first NFET configured to pull the first bitline toward ground in response to the second bitline reaching a first voltage, the second NFET configured to pull the second bitline toward ground in response to the first bitline reaching a second voltage, the first bitline and the second bitline configured to rise in voltage in response to a rising wordline voltage applied to a non-volatile memory cell having a programmed FET and an unprogrammed FET;
a first inverter connected to the first bitline;
a second inverter connected to the second bitline; and
a first PFET connected to the first bitline and a second PFET connected to the second bitline, the first PFET configured to pull the first bitline up to a supply voltage in response to the a first output of the first inverter reaching a first threshold voltage for the first PFET, the second PFET configured to pull the second bitline up to the supply voltage in response to a second output of the second inverter reaching a second threshold voltage for the second PFET.

2. The circuit of claim 1, further comprising:
a third inverter connected to the first bitline and a fourth inverter connected to the second bitline, the third inverter configured to output a high signal in response to a low voltage of the first bitline, the third inverter further configured to output a low signal in response to a high voltage of the first bitline, the fourth inverter configured to output a high signal in response to a low voltage of the second bitline, the fourth inverter further configured to output a low signal in response to a high voltage of the second bitline.

3. The circuit of claim 1, further comprising:
a third NFET connected to the first bitline; the third NFET configured to bring the first bitline toward ground in response to a precharge signal; and
a fourth NFET connected to the second bitline; the fourth NFET configured to bring the second bitline toward ground in response to the precharge signal.

4. The circuit of claim 3, further comprising:
a fifth NFET connected to the first bitline and the second bitline, the fifth NFET configured to balance the first bitline and the second bitline in response to the precharge signal.

5. The circuit of claim 4, wherein the first bitline and second bitline are further configured to rise in response to a second rising wordline applied to a second nonvolatile memory cell having a second programmed FET and a second unprogrammed FET.

6. A memory circuit comprising:
a nonvolatile memory cell having two FETs, the two FETs connected to a wordline, the two FETs including a first FET and a second FET, the first FET configured to increase voltage on a first bitline in response to increasing voltage on the wordline, the second FET configured to increase voltage on a second bitline in response to increasing voltage on the wordline;
a first NFET connected to the first bitline and a second NFET connected to the second bitline, the first NFET configured to pull the first bitline toward ground in response to the second bitline reaching a first voltage, the second NFET configured to pull the second bitline toward ground in response to the first bitline reaching a second voltage;
a first inverter connected to the first bitline;
a second inverter connected to the second bitline; and
a first PFET connected to the first bitline and a second PFET connected to the second bitline, the first PFET configured to pull the first bitline up to a supply voltage in response to the a first output of the first inverter reaching a first threshold voltage for the first PFET, the fourth PFET configured to pull the second bitline up to the supply voltage in response to a second output of the second inverter reaching a second threshold voltage for the second PFET.

7. The memory circuit of claim 6, further comprising:
a third inverter connected to the first bitline and a fourth inverter connected to the second bitline, the third inverter configured to output a high signal in response to a low voltage of the first bitline, the third inverter further configured to output a low signal in response to a high voltage of the first bitline, the fourth inverter configured to output a high signal in response to a low voltage of the second bitline, the fourth inverter further configured to output a low signal in response to a high voltage of the second bitline.

8. The memory circuit of claim 6, further comprising:
a third NFET connected to the first bitline; the third NFET configured to bring the first bitline toward ground in response to a precharge signal; and
a fourth NFET connected to the second bitline; the fourth NFET configured to bring the second bitline toward ground in response to the precharge signal.

9. The memory circuit of claim 8, further comprising:
a fifth NFET connected to the first bitline and the second bitline, the fifth NFET configured to balance the first bitline and the second bitline in response to the precharge signal.

10. The memory circuit of claim 9, wherein the first FET is programmed to have a higher voltage threshold than the second FET.

11. The memory circuit of claim 10, wherein the first FET is programmed using charge trapping.

12. The memory circuit of claim 11, further comprising:
a second nonvolatile memory cell having a third FET and a fourth FET connected to a second wordline, the third FET configured to increase voltage on the first bitline in response to increasing voltage on the second wordline, the fourth FET configured to increase voltage on a second bitline in response to increasing voltage on the second wordline.

* * * * *